United States Patent
Webb

(10) Patent No.: US 7,763,965 B2
(45) Date of Patent: Jul. 27, 2010

(54) STRESS RELIEF STRUCTURES FOR SILICON INTERPOSERS

(75) Inventor: Bucknell Chapman Webb, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 301 days.

(21) Appl. No.: 11/860,613

(22) Filed: Sep. 25, 2007

(65) Prior Publication Data

US 2009/0079071 A1    Mar. 26, 2009

(51) Int. Cl.
*H01L 23/22* (2006.01)
*H01L 23/24* (2006.01)
*H01L 21/44* (2006.01)

(52) U.S. Cl. .................. 257/687; 257/E23.021; 257/E23.023; 257/E23.067; 257/E21.499; 438/107; 438/108; 438/118; 438/612; 438/613

(58) Field of Classification Search .................. 438/107, 438/108, 118, 119, 122, 612–614; 257/687, 257/700–703, E23.021, E23.023, E23.067, 257/E21.503, E21.499
See application file for complete search history.

(56) References Cited

U.S. PATENT DOCUMENTS

| | | | |
|---|---|---|---|
| 5,682,061 A | 10/1997 | Khandros et al. | |
| 6,595,784 B2 | 7/2003 | Brodsky et al. | |
| 7,012,018 B2 | 3/2006 | Tellkamp | |
| 7,095,108 B2 | 8/2006 | Palanduz | |
| 7,123,466 B2 | 10/2006 | He et al. | |
| 2002/0011657 A1 | 1/2002 | Saito | |
| 2004/0169277 A1 | 9/2004 | Matsuda | |
| 2004/0173914 A1* | 9/2004 | Kurihara et al. | 257/778 |

FOREIGN PATENT DOCUMENTS

| JP | 2000-277659 | 10/2000 |
|---|---|---|
| JP | P2005-203488 A * | 7/2005 |

\* cited by examiner

*Primary Examiner*—Hsien-ming Lee
(74) *Attorney, Agent, or Firm*—Schmeiser, Olsen & Watts; Daniel P. Morris

(57) ABSTRACT

An electronic device and method of making the device. The device includes: a carrier; a silicon interposer connected to a top surface of the carrier, the interposer having wires extending from a top surface of the interposer, through the interposer, to a bottom surface of the interposer, the wires at the bottom surface of the interposer electrically connected to wires in a top surface of the carrier; an integrated circuit chip connected to the top surface of the interposer, wires at a surface of the integrated circuit chip electrically connected to the wires in the top surface of the interposer; and a stress relief structure attached to the interposer, the stress relief structure either (i) not electrically connected to the wires of the interposer or integrated circuit chip or (ii) electrically connected to ground by wires of the interposer or wires of the integrated circuit chip.

19 Claims, 3 Drawing Sheets

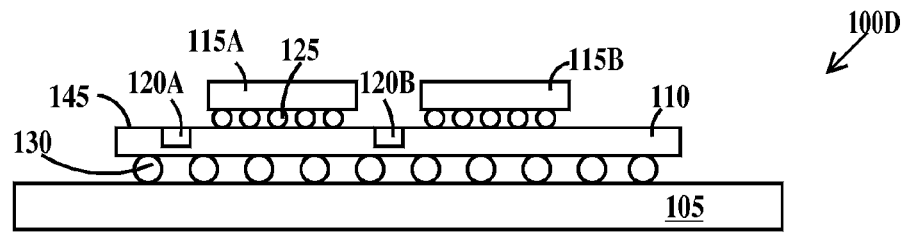
FIG. 5
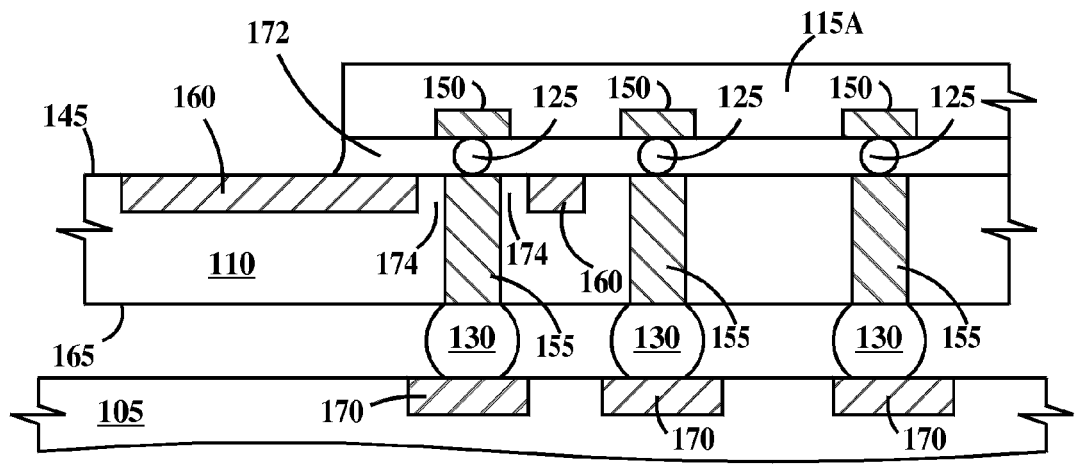
FIG. 6
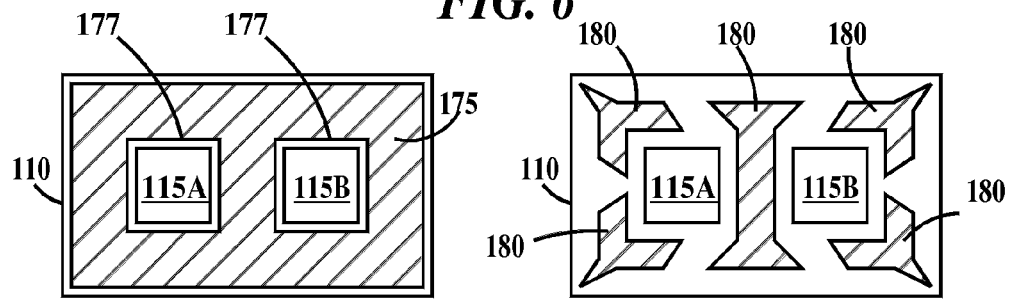
FIG. 7     FIG. 8
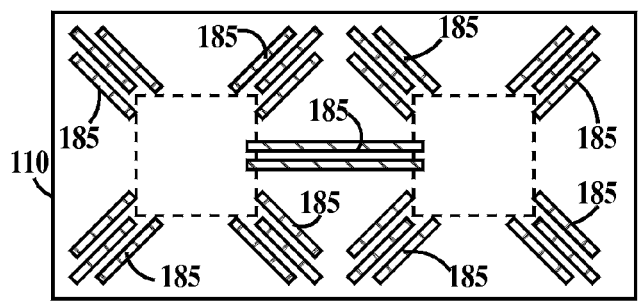
FIG. 9

12

STRESS RELIEF STRUCTURES FOR SILICON INTERPOSERS

FIELD OF THE INVENTION

The present invention relates to the field of integrated circuit devices; more specifically, it relates to stress relieved interposer structures and methods of fabricating stress relieved interposer structures.

BACKGROUND OF THE INVENTION

An interposer is a device with electrical through vias that is inserted between one or more integrated circuit chips and a carrier. The through vias allow the integrated circuit chips to be electrically connected to the carrier. During operation of the integrated circuit chip, heating of the integrated circuit chip and/or the interposer can occur causing thermal expansion of the integrated circuit chip and/or the interposer leading to failures of the integrated circuit chip and/or the interposer. Accordingly, there exists a need in the art to overcome the deficiencies and limitations described hereinabove.

SUMMARY OF THE INVENTION

A first aspect of the present invention is a structure, comprising: a carrier; a silicon interposer mechanically connected to a top surface of the carrier, the interposer having wires extending from a top surface of the interposer, through the interposer, to a bottom surface of the interposer, the wires that are exposed at the bottom surface of the interposer electrically connected to wires exposed in a top surface of the carrier; an integrated circuit chip mechanically connected to the interposer, wires exposed at a surface of the integrated circuit chip electrically connected to the wires exposed in the top surface of the interposer; and a stress relief structure attached to the top surface of the interposer, the stress relief structure either (i) not electrically connected to the wires of the interposer or integrated circuit chip or (ii) electrically connected to ground through the wires of the interposer or through the wires of the integrated circuit chip.

A second aspect of the present invention is a method, comprising: connecting a silicon interposer to a top surface of a carrier, the interposer having wires extending from a top surface of the interposer, through the interposer, to a bottom surface of the interposer, the wires that are exposed at the bottom surface of the interposer electrically connected to wires exposed in a top surface of the carrier; connecting an integrated circuit chip to the top surface of the interposer, wires exposed at a surface of the integrated circuit chip electrically connected to the wires exposed in the top surface of the interposer; and forming a stress relief structure attached to the interposer, the stress relief structure either (i) not electrically connected to the wires of the interposer or integrated circuit chip or (ii) electrically connected to ground through the wires of the interposer or through the wires of the integrated circuit chip.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 5 a cross-sectional view through line 5-5 of FIG. 1, illustrating an embodiment of the present invention;

FIG. 6 is a cross-sectional view illustrating electrical interconnections and stress relief structures in more detail according to embodiments of the present invention;

FIGS. 7, 8 and 9 are top views illustrating layouts of stress relief structures according to embodiments of the present invention;

DETAILED DESCRIPTION OF THE INVENTION

The stress relief structures in the interposer of the embodiments of the present invention act as reinforcing elements either by imparting compressive forces on the interposers or simply acting to increase the strength of the interposer in the regions of the interposer they are attached to.

Figure 1:
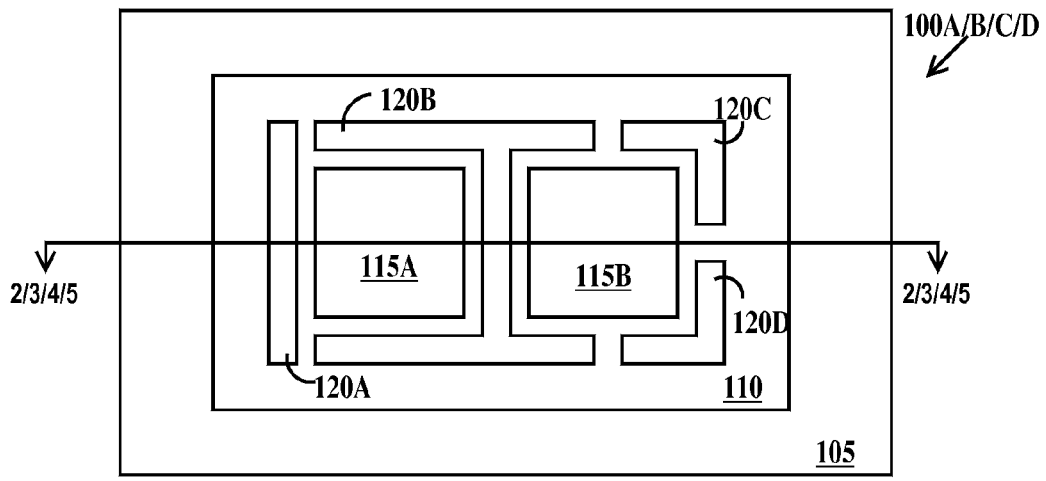
FIG. 1 a top view of an assembly according to embodiments of the present invention.

FIG. 1 a top view of an assembly according to embodiments of the present invention. In FIG. 1, an electronic assembly 100A (or 100B or 100C or 100D) includes a carrier 105, an interposer 110 mounted on and electrically connected to the carrier, integrated circuit chips 115A and 115B mounted on and electrically connected to the interposer, and stress relief structures 120A, 120B, 120C and 120D physically attached to the interposer. In one example, there is no electrical connection between carrier 105, interposer 110 and integrated circuit chips 115A and 115B and stress relief structures 120A, 120B, 120C and 120D. In one example, when stress relief structures 120A, 120B, 120C and 120D comprise metal, they may be grounded (e.g., connected only to ground or a single terminal of a power supply connected to the integrated circuit chips) to carrier 105, interposer 110, integrated circuit chips 115A and 115B or a combination thereof by wires in the integrated circuit chips, interposer and carrier. In one example, integrated circuit chips 115A and 115B independently comprise a bulk single-crystal silicon substrate, a (single-crystal) silicon-on-insulator (SOI) substrate or other semiconductor material such as SiGe, Ge, GaAs and InP. In one example, interposer 105 comprises silicon. In one example, interposer 105 comprises single-crystal silicon. In one example, carrier 105 is a printed circuit board or a ceramic module. In one example, interposer 110 may include multiple wiring layers, resistors, capacitors, inductors, diodes, transistors, electrostatic discharge devices and circuits and circuits comprised of combinations of resistors, capacitors, inductors, diodes and transistors. While only two integrated circuit chips (i.e., 115A and 115B) are illustrated, as an example) in FIG. 1, there may a few as one and more than two integrated circuits chips attached to interposer 110. In one example, stress relief structures 120A, 120B, 120C and 120D (and other stress relief structures described infra) comprise a material selected from the group consisting of silicon, tungsten, ceramic, silicon dioxide, silicon nitride, tantalum, titanium, tantalum nitride, titanium nitride and Invar. It is advantageous that stress relief structures according to the embodiments of the present invention be in tensile stress and impart compressive stress to interposer 110.

The shapes of stress relief structures 120A, 120B, 120C and 120 are exemplary. Stress relief structure 120A is a bar, Stress relief structure 120B is H-shaped and stress relief structures 120C and 120D are L-shaped. In practice any combination of these shapes or other shapes may be used.

Figure 2:
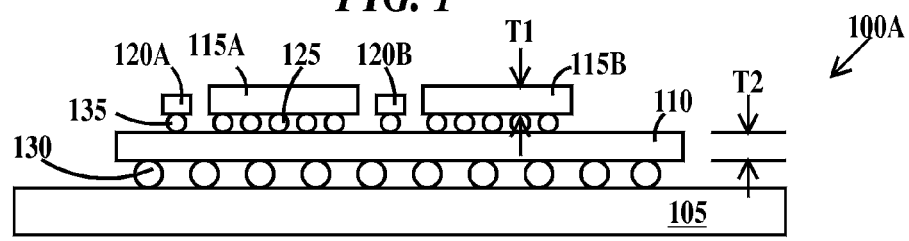
FIG. 2 is a cross-sectional view through line 2-2 of FIG. 1, illustrating an embodiment of the present invention.

FIG. 2 is a cross-sectional view through line 2-2 of FIG. 1, illustrating an embodiment of the present invention. In FIG. 2, electronic assembly 100A includes solder connections 125 electrically and mechanically connecting integrated circuit chips 115A and 115B to interposer 110 and solder connections 130 electrically and mechanically interconnecting interposer 110 to carrier 105. Additional solder connections 135 mechanically connect stress relief structures 120A and 120B (also 120C and 120D not shown in FIG. 2) to interposer 110. In one example, solder connections 125, 130 and 135 are independently solder bumps (also called C4 for controlled chip collapse connection), solder balls, solder coated copper balls or solder columns. Integrated circuit chips 115A and 115B have a thickness T1 and interposer 110 has a thickness T2. In one example T1 is between about 100 and about 700 microns. In one example, T2 is between about 10 and about 300 microns. Not all integrated circuit chips attached to interposer 110 need be the same thickness.

Figure 3:
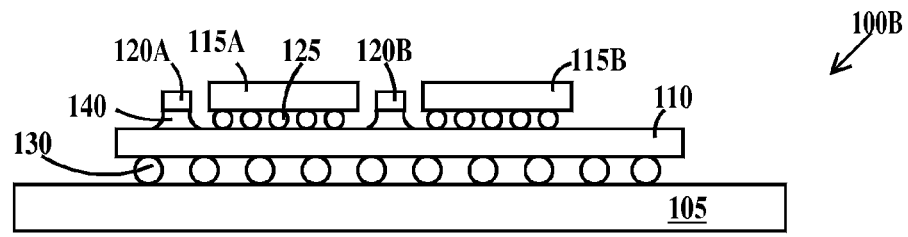
FIG. 3 is a cross-sectional view through line 3-3 of FIG. 1, illustrating an embodiment of the present invention.

FIG. 3 is a cross-sectional view through line 3-3 of FIG. 1, illustrating an embodiment of the present invention. In FIG. 3, an electronic assembly 100B is similar to electronic assembly 100A of FIG. 2 except stress relief structures 120A and 120B (also 120C and 120D not shown in FIG. 3) are attached to interposer 110 by adhesive 140. In one example, adhesive 140 comprises an epoxy resin. In another example, the adhesive is a die underfill material, which is also applied under, and around one or more of the integrated circuit chips.

Figure 4:
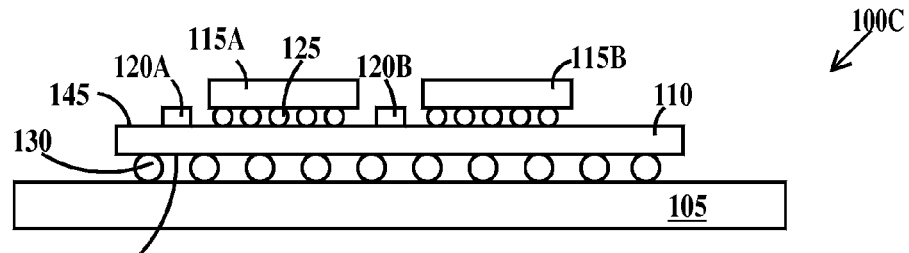
FIG. 4 is a cross-sectional view through line 4-4 of FIG. 1, illustrating an embodiment of the present invention.

FIG. 4 is a cross-sectional view through line 4-4 of FIG. 1, illustrating an embodiment of the present invention. In FIG. 4, an electronic assembly 100C is similar to electronic assembly 100A of FIG. 2 except stress relief structures 120A and 120B (also 120C and 120D not shown in FIG. 4) are formed directly top surface 145 of interposer 110 by deposition, evaporation, electroless plating or electrical plating. Alternatively, stress relief structures 120A and 120B (also 120C and 120D not shown in FIG. 4) may be formed on a bottom surface 147 of interposer 110. Alternatively, stress relief structures 120A and 120B (also 120C and 120D not shown in FIG. 4) may be formed on top surface 145 and additional stress relief structures may be formed on a bottom surface 147 of interposer 110 by deposition, evaporation, electroless plating or electrical plating.

FIG. 5 a cross-sectional view through line 5-5 of FIG. 1, illustrating an embodiment of the present invention. In FIG. 5, an electronic assembly 100D is similar to electronic assembly 100A of FIG. 2 except stress relief structures 120A and 120B (also 120C and 120D not shown in FIG. 5) are damascened into interposer 110 from one or more of the top or bottom surfaces 145 of the interposer 110. Damascene processes are described infra in reference to FIGS. 10A through 10D and 11A through 11E. This embodiment of the present invention is particularly well suited in cases where it is desirable that stress relief structures extend under the integrated circuit chip(s).

Additional stress relief structures formed on bottom surface of interposer by deposition, evaporation, electroless plating or electrical plating may be used in combination with stress relieve structures attached to top surface of interposer by solder connections (see FIG. 2), adhesive (see FIG. 3) or damascened into to the top surface (see FIG. 5).

FIG. 6 is a cross-sectional view illustrating electrical interconnections and stress relief structures in more detail according to embodiments of the present invention. In FIG. 6, the damascene stress relief structure embodiment is used as an example. Any of the other stress relied structures described supra may be substituted. In FIG. 6, integrated circuit chip 115A is attached to a top surface 145 of interposer 110 by solder ball connections 125 between electrically conductive pads 150 on a top surface of the integrated chip (the chip is flip-chip mounted) and through electrically conductive vias (or wires) 155 of interposer 110. Damascene stress relief structures 160 are formed adjacent to top surface 145 of interposer 110. Through vias 155 extend from top surface 145 to a bottom surface 165 of interposer 110. Interposer 100 is attached to carrier 105 by solder connections 130 between vias 155 and wires 170 in carrier 105. Optionally, a filler material 172 (e.g., epoxy or silicon oxide filled epoxy) is injected between integrated circuit chip 115A and interposer 110. Regions of stress relief structure 150 are formed between integrated circuit chip 115A and interposer 110. As an example, one through via 155 is aligned in an opening 174 formed in stress relief structure 160.

FIGS. 7, 8 and 9 are top views illustrating layouts of stress relief structures according to embodiments of the present invention. In FIG. 7, a stress relief structure 175 comprises a plate having openings 177 for integrated circuit chips 115A and 115B. In FIG. 8, stress relief structures 180 have shapes that have been modeled (for example, by finite element analysis) to reduce stress in interposer 110 to specified levels in specified regions of the interposer. In FIG. 9, a multiplicity of sets of stress relief structures 185 have been attached to interposer 110. Stress relief structures 175, 180 and 185 may have any of the cross-sectional structures illustrated in FIGS. 2, 3, 4, 5 and 6.

Figure 10A:
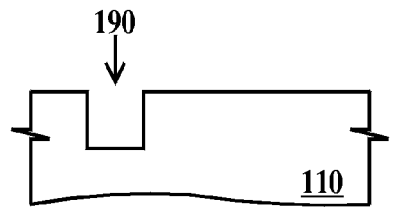
FIGS. 10A through 10D are cross-sections illustrating a method of fabricating the interposer structure of FIG. 5.
Figure 10B:
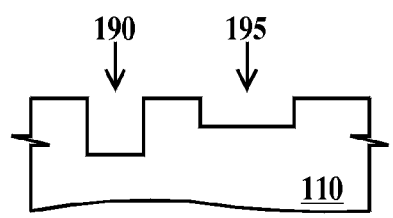
Figure 10C:
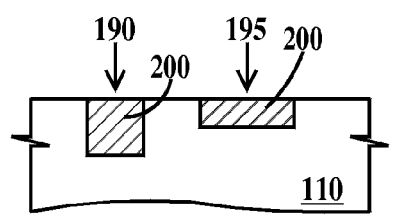
Figure 10D:
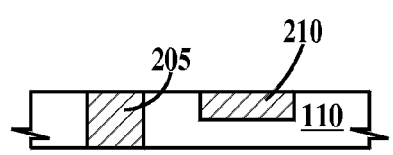

FIGS. 10A through 10D are cross-sections illustrating a method of fabricating the interposer structure of FIG. 5. In FIG. 10A, a via opening (or trench) 190 is formed in interposer 110 using any number of conventional photolithography and etch processes. In FIG. 10B, a trench 195 is etched into interposer 110 by use of any number of conventional photolithography and etch processes. Via opening 190 and trench 195 are lined with an insulating layer (not shown). Via opening 190 is deeper than trench 195. In FIG. 10C, via opening 190 and trench 195 are simultaneously filled with an electrically conductive material 200 (e.g., a metal or metal nitride) by any number of well known means, such as deposition or plating, optionally followed by a planarization process such as chemical-mechanical-polishing (CMP). In FIG. 10D, interposer 110 is thinned from the side opposite from fill material 200 (see FIG. 10C) to complete a through via 205 and a damascened stress relief structure 210. Thinning may be accomplished by CMP or etching the bottom of interposer 110 in a concentrated aqueous basic solution.

Figure 11A:
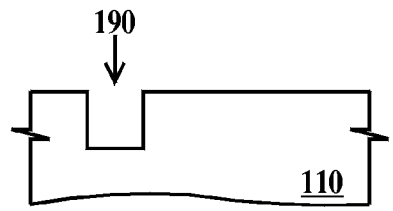
FIGS. 11A through 11E are cross-sections illustrating an alternative method of fabricating the interposer structure of FIG. 5.
Figure 11B:
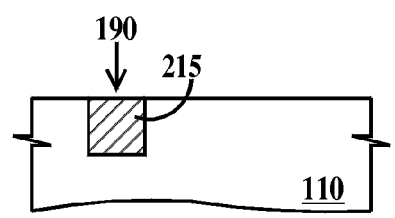
Figure 11C:
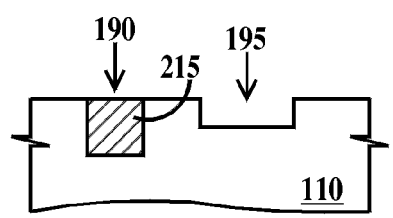
Figure 11D:
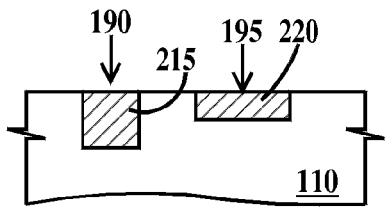
Figure 11E:
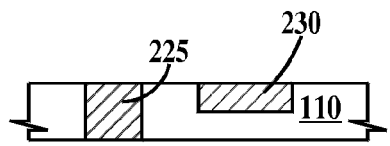

FIGS. 11A through 11D are cross-sections illustrating an alternative method of fabricating the interposer structure of FIG. 5. In FIG. 11A, via opening 190 is formed in interposer 110 using any number of conventional photolithography and etch processes. Via opening 190 is lined with an insulating layer (not shown). In FIG. 11B, via opening 190 is filled with an electrically conductive first material 215 (e.g., a metal or metal nitride) by any number of well known means, such as deposition or plating, followed by a planarization process such as chemical-mechanical-polishing (CMP). In FIG. 11C, a trench 195 is etched into interposer 110 by use of any number of conventional photolithography and etch processes. Trench 195 may be lined with an insulating layer (not shown). In FIG. 11D, trench 195 is filled with a material 220 by any number of well known means, such as deposition or plating, followed by a planarization process such as chemical-mechanical-polishing (CMP). In FIG. 11E, interposer 110 is thinned from the side opposite from fill materials 215 and 220 (see FIG. 11D) to complete a through via 225 and a damascened stress relief structure 230. In one example fill material 215 comprises copper. In one example stress relief material 220 comprises silicon, tungsten, ceramic, silicon dioxide, silicon nitride, tantalum, titanium, tantalum nitride, titanium nitride or Invar.

In another embodiment, a stress reliever is deposited on the bottom of the interposer, after interposer wafer thinning (described in prior art), by any of the aforementioned material deposition processes and conventional masking and etch processes. This stress reliever on the bottom side can also be combined with a stress reliever on the top surface formed as previously described.

Thus the present invention provides stress relieved interposer structures and methods of fabricating stress relieved interposer structures.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   a carrier;
   a silicon interposer mechanically connected to a top surface of said carrier, said interposer having vias extending from a top surface of said interposer, through said interposer, to a bottom surface of said interposer, said vias that are exposed at said bottom surface of said interposer electrically connected to wires exposed in a top surface of said carrier;
   an integrated circuit chip mechanically connected to said top surface of said interposer, electrically conductive pads exposed at a surface of said integrated circuit chip electrically connected to said vias exposed in said top surface of said interposer;
   one or more stress relief structures formed entirely in said interposer, said one or more stress relief structures either (i) not electrically connected to said vias of said interposer or to said electrically conductive pads of said integrated circuit chip or (ii) electrically connected to ground through said vias of said interposer or through said electrically conductive pads of said integrated circuit chip; and
   wherein said one or more stress relief structures are in tensile stress.

2. The structure of claim 1, wherein said one or more stress relief structures are attached to said interposer by solder.

3. The structure of claim 1, wherein said one or more stress relief structures are attached to said interposer by adhesive.

4. The structure of claim 1, wherein said one or more stress relief structures extend between said integrated circuit chip and said interposer.

5. The structure of claim 1, wherein said one or more stress relief structures are positioned on regions of said interposer that are adjacent to a perimeter of said integrated circuit chip.

6. The structure of claim 1, wherein said one or more stress relief structures comprise a material selected from the group consisting of silicon, tungsten, ceramic, silicon dioxide, silicon nitride, tantalum, titanium, tantalum nitride, titanium nitride and Invar.

7. The structure of claim 1, wherein said interposer is physically and electrically attached to said carrier by solder balls.

8. A method, comprising:
   connecting a silicon interposer to a top surface of a carrier, said interposer having vias extending from a top surface of said interposer, through said interposer, to a bottom surface of said interposer, said vias that are exposed at said bottom surface of said interposer electrically connected to wires exposed in a top surface of said carrier;
   connecting an integrated circuit chip to said top surface of said interposer and electrically connecting, electrically conductive pads exposed at a surface of said integrated circuit chip to said vias exposed in said top surface of said interposer;
   forming one or more stress relief structures entirely within said interposer, said one or more stress relief structures either (i) not electrically connected to said vias of said interposer or to said electrically conductive pads of said integrated circuit chip or (ii) electrically connected to ground through said vias of said interposer or through said electrically conductive pads of said integrated circuit chip; and
   wherein said one or more stress relief structures are in tensile stress.

9. The method of claim 8, further including:
   attaching said one or more stress relief structures to said interposer by solder connections.

10. The method of claim 8, further including:
    attaching said one or more stress relief structures to said interposer with adhesive.

11. The method of claim 8, further including:
    etching a first set of trenches extending from said top surface of said interposer into said interposer to a first depth,
    filling said first trenches with an electrically conductive material;
    said forming said one or more stress relief structure includes etching a second set of trenches extending from said top surface of said interposer into said interposer to a second depth, said second depth less than said first depth and filling said second trenches with stress relief material; and
    thinning said interposer to expose said electrically conductive material in said first trenches at said bottom surface of said interposer.

12. The method of claim 8, further including:
    etching a first set of trenches extending from said top surface of said interposer into said interposer to a first depth;
    etching a second set of trenches extending from said top surface of said interposer into said interposer to a second depth, said first depth greater than said second depth;
    simultaneously filling said first and second trenches with an electrically conductive material to form said one or more stress relief structures in said second trenches; and
    thinning said interposer to expose said electrically conductive material in said first trenches at said bottom surface of said interposer.

13. The method of claim 8, wherein said one or more stress relief structures are positioned on regions of said interposer that are adjacent to a perimeter of said integrated circuit chip.

14. The method of claim 8, wherein said one or more stress relief structures comprise a material selected from the group consisting of silicon, tungsten, ceramic, silicon dioxide, silicon nitride, tantalum, titanium, tantalum nitride, titanium nitride and Invar.

15. The method of claim 8, wherein said integrated circuit chip is physically and electrically attached to said interposer by solder balls and wherein said interposer is physically and electrically attached to said carrier by solder balls.

16. The method of claim 8, wherein said forming said one or more stress relief structures includes depositing one or more layers on said top surface of said interposer by sputtering, evaporation, electroless plating or electrical plating.

17. The method of claim 8, wherein said forming said one or more stress relief structure includes depositing one or more layers on said bottom surface of said interposer by sputtering, evaporation, electroless plating or electrical plating.

18. The method of claim 8, wherein said forming said stress relief structure includes (i) depositing one or more layers on said top surface of said interposer by sputtering, evaporation or electrochemical deposition and (ii) depositing one or more layers on said bottom surface of said interposer by sputtering, evaporation, electroless plating or electrical plating.

19. A structure, comprising:

a carrier;

a silicon interposer mechanically connected to a top surface of said carrier, said interposer having vias extending from a top surface of said interposer, through said interposer, to a bottom surface of said interposer, said vias that are exposed at said bottom surface of said interposer electrically connected to wires exposed in a top surface of said carrier;

an integrated circuit chip mechanically connected to said top surface of said interposer, electrically conductive pads exposed at a surface of said integrated circuit chip electrically connected to said vias exposed in said top surface of said interposer;

one or more stress relief structures formed entirely in said interposer, said one or more stress relief structures either (i) not electrically connected to said vias of said interposer or to said electrically conductive pads of said integrated circuit chip or (ii) electrically connected to ground through said vias of said interposer or through said electrically conductive pads of said integrated circuit chip; and wherein said one or more stress relief structures are attached to said interposer by solder.

* * * * *